United States Patent
Kong et al.

(10) Patent No.: US 9,543,244 B2
(45) Date of Patent: *Jan. 10, 2017

(54) HYBRID PACKAGE TRANSMISSION LINE CIRCUITS

(71) Applicant: Intel Corporation, Santa Clara, CA (US)

(72) Inventors: Chung Peng Jackson Kong, Tanjung Tokong (MY); Chang-Tsung Fu, Portland, OR (US); Telesphor Kamgaing, Chandler, AZ (US); Chan Kim Lee, Bayan Lepas (MY); Ping Ping Ooi, Butterworth (MY)

(73) Assignee: Intel Corporation, Santa Clara, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 14/543,838

(22) Filed: Nov. 17, 2014

(65) Prior Publication Data

US 2015/0069629 A1     Mar. 12, 2015

Related U.S. Application Data

(63) Continuation of application No. 13/538,887, filed on Jun. 29, 2012, now Pat. No. 8,890,302.

(51) Int. Cl.
*H01L 23/522* (2006.01)
*H01L 23/52* (2006.01)
(Continued)

(52) U.S. Cl.
CPC ..... *H01L 23/5226* (2013.01); *H01L 23/49822* (2013.01); *H01L 23/49827* (2013.01); *H01L 23/528* (2013.01); *H01L 2224/16* (2013.01)

(58) Field of Classification Search
CPC .......... H01L 23/49827; H01L 23/5226; H01L 23/49833; H01L 23/5384; H01L 2225/1041; H01L 23/49822; H01L 2225/107; H01L 2225/06548; H01L 2224/97; H01L 24/97; H01L 27/3297; H05K 2201/10712; H05K 2201/1075; H05K 2201/10795
(Continued)

(56) References Cited

U.S. PATENT DOCUMENTS

5,847,936 A   12/1998   Forehand et al.
6,008,534 A   12/1999   Fulcher
(Continued)

*Primary Examiner* — Jose R Diaz
(74) *Attorney, Agent, or Firm* — Blakely, Sokoloff, Taylor & Zafman LLP (57) ABSTRACT

"Hybrid" transmission line circuits employing multiple interconnect levels for the propagation, or return, of a single signal line across a package length are described. In package transmission line circuit embodiments, a signal line employs co-located traces in two different interconnect levels that are electrically coupled together. In further embodiments, a reference plane is provided above, below or co-planar with at least one of the co-locate traces. In embodiments, a balanced signal line pair includes first and second co-located traces in two adjacent interconnect levels as a propagation signal line and third and fourth co-located traces in the two adjacent interconnect levels as a return signal line with a ground plane co-planar with, and/or above and/or below the two adjacent interconnect levels.

22 Claims, 6 Drawing Sheets

(51) Int. Cl.
*H01L 23/498* (2006.01)
*H01L 23/528* (2006.01)

(58) Field of Classification Search
USPC .................................. 257/686, 690, 774
See application file for complete search history.

(56) References Cited

U.S. PATENT DOCUMENTS

| | | |
|---|---|---|
| 6,556,416 B2 | 4/2003 | Kunihiro |
| 6,750,403 B2 | 6/2004 | Peterson |
| 6,967,398 B2 | 11/2005 | Frech et al. |
| 7,015,574 B2 | 3/2006 | Alcoe et al. |
| 7,088,200 B2 | 8/2006 | Bartley et al. |
| 7,154,356 B2 | 12/2006 | Brunette et al. |
| 7,326,643 B2 | 2/2008 | Desai et al. |
| 7,378,745 B2 | 5/2008 | Hayashi et al. |
| 7,457,132 B2 | 11/2008 | Gisin et al. |
| 7,745,922 B2 | 6/2010 | Lee |
| 7,787,252 B2 | 8/2010 | Mertol |
| 7,937,830 B2 | 5/2011 | Shioga et al. |
| 8,649,183 B2 * | 2/2014 | Green .................... H05K 1/182 174/260 |
| 8,890,302 B2 * | 11/2014 | Kong et al. ................... 257/692 |
| 2002/0057558 A1 | 5/2002 | Barrow |
| 2010/0148316 A1 * | 6/2010 | Kim et al. ..................... 257/621 |
| 2011/0140126 A1 * | 6/2011 | Gaul .................. H01L 23/3677 257/77 |

* cited by examiner

HYBRID PACKAGE TRANSMISSION LINE CIRCUITS

This is a Continuation Application of Ser. No. 13/538,887, filed on Jun. 29, 2012, which is presently pending.

TECHNICAL FIELD

Embodiments of the present invention generally pertain to integrated circuit packages, and more particularly to package substrate transmission lines.

BACKGROUND

High speed signaling poses significant challenges with respect to signal loss between an integrated circuit (IC) operable in such a high frequency range and off-chip terminals, such as an antenna for wireless applications. The path between the IC and off-chip signal origin/designation generally includes a package of the IC. Interconnect routing in the IC package responsible for carrying such high speed signals typically employs a transmission line circuit for containing the electromagnetic wave as it is propagated. Stripline, coplanar waveguides (CPW) and microstrip circuits may be used as a package-level transmission line. However, as signal frequency increases into the gigahertz regime (e.g., 0.9 GHz-100 GHz), losses in the metal trace and surrounding dielectric become more severe. Currently, this phenomenon is mitigated by increasing the package transmission line circuit trace width. This however increases the package form factor (both footprint and z-height), and exacerbates noise coupling issues, neither of which is desirable for the ultra-mobile devices of tomorrow.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are package-level transmission line circuits that reduce electrical losses for high frequency signals, particularly for 0.9 GHz and above, and more particularly for 2.4 GHz and above, for a given circuit trace width (i.e., lateral critical dimension) and thickness (i.e., z-height). In particular embodiments, characteristic impedance ($Z_0$) of the transmission line circuit running a routing path across a surface of the package substrate and having a given trace width is better matched with the characteristic impedance of vertical vias passing through the package substrate (i.e., through core vias, microvias) which enables an ultra-steep rise/fall time (e.g., 5 picoseconds).

Figure 1A:
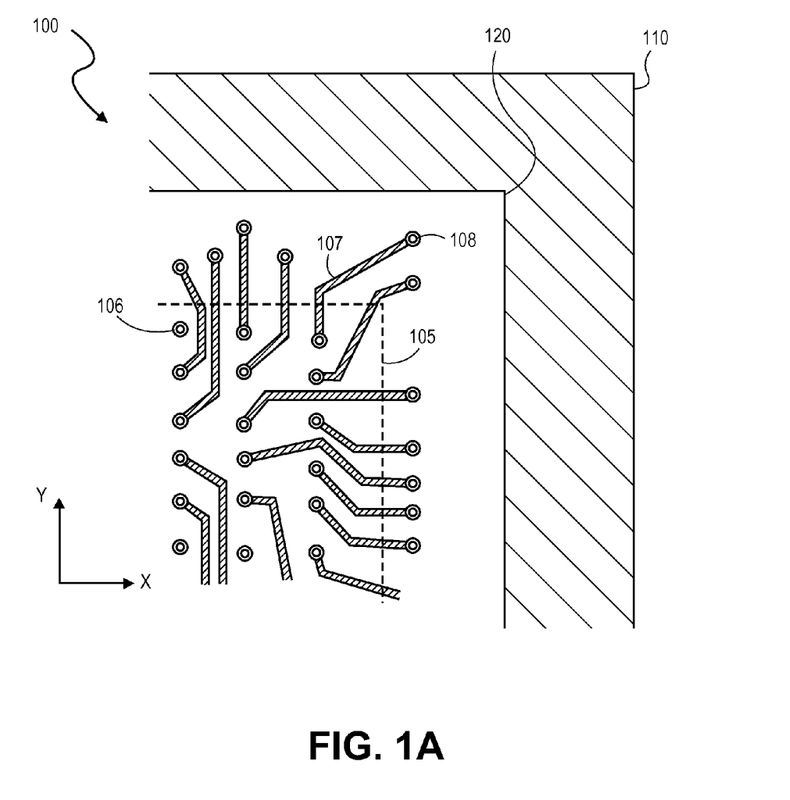
FIG. 1A is a plan view of system including an integrated circuit (IC) chip interfacing to a package substrate, in accordance with an embodiment.

FIG. 1A is a plan view of a system 100 including an integrated circuit (IC) chip 105 interfacing to a package substrate 120, in accordance with an embodiment. The IC chip 105 is illustrated with dashed line border to represent a view through the IC chip 105 (or a view that would be visible as an IC chip is polished through to the underlying package interface). As shown, array elements 106 interface to the package substrate 120. In the exemplary embodiment the array elements 106 may be solder balls, copper bumps, gold studs or a combination of copper bumps and solder caps, for a flip-chip grid array (FCPGA, FCBGA, etc.), but embodiments of the present invention are applicable to any substrate assembly technologies, such as flip-chip-molded matrix array packages (FCMMAP), eWLB, embedded dies, bumpless assembly, etc. System 100 further includes a board 110, such as a printed circuit board (PCB), or the like, to which the package substrate 120 is further coupled by second level interconnects 111.

The package substrate 120 includes a plurality of conductive interconnect levels, or redistribution layers (RDL), over which signals are routed to and from the array elements 106. As shown in FIG. 1A, at least one interconnect level of the package substrate 120 includes escape routing 107. The escape routing 107 occurs within a breakout region of the package substrate and is functionally the region of the package interconnect which carries signals to/from a first package transmission line terminus 108. Depending on many design criteria, such as number of array elements 106, perimeter and area of the IC chip 105, and dimensions of a package transmission line, etc. the breakout region may require more or less routing length, and one or more interconnect levels.

Figure 1B:
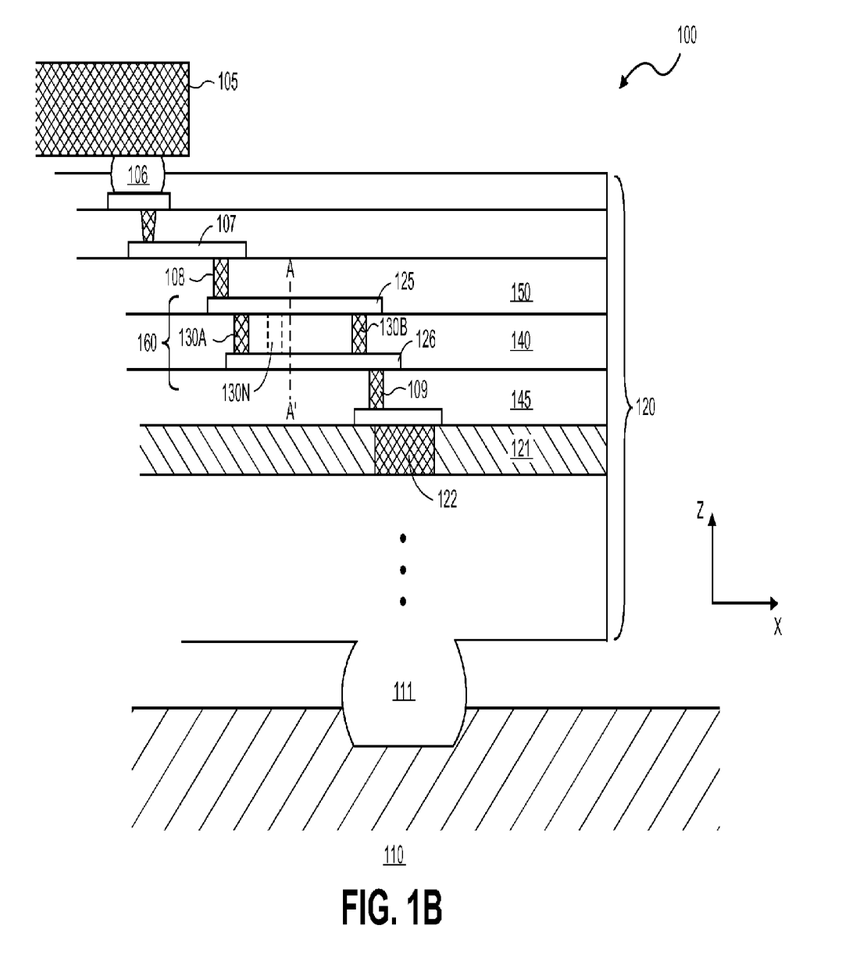
FIG. 1B is a cross-sectional view of the system illustrated in FIG. 1A, illustrating a package transmission path in accordance with an embodiment.

FIG. 1B is a cross-sectional view of the system of FIG. 1A along an arbitrary x-z plane, further illustrating a package transmission line circuit 160, which forms a part of a transmission line path (i.e., transmission line circuit 160 is a segment of the transmission line path), in accordance with an embodiment. Therefore, as used herein, a transmission line path is representative of routing for the signal from the chip 105 to the second level interconnect 111. Generally, the package substrate 120 includes a core 121 and a plurality of build-up layers, with each build-up layer including an interconnect level for trace routing and a dielectric layer for electrically insulating laterally adjacent traces as well as adjacent interconnect levels (overlying and underlying). In alternative embodiments, a coreless substrate including only build-up layers is utilized in substantially the same manner as described herein in the context of a cored substrate. With two or more build-up layers on both sides of the core 121, four, or more, interconnect layers may be provided in the package substrate 120. In the embodiment shown, the package transmission line circuit 160 begins at the first terminus 108, which in the exemplary embodiment is a via to an upper interconnect level in which the escape routing 107 is provided. In alternate embodiments, the transmission line circuit 160 may also include the escape routing (e.g., with the first terminus 108 being a C4 bump). While conventional techniques employ independent trace routing, the package transmission line circuit 160 includes a first trace 125 on a first electrically conductive interconnect level of the package substrate 120, and a second trace 126, co-located with the first trace 125, but on a second electrically conductive interconnect level of the package substrate 120. Separating the first and second traces 125, 126 is a first electrically isolative dielectric material 140.

The transmission line circuit 160 includes a plurality of vias 130 extending through the first dielectric material 140 and electrically coupling the first and second traces 125, 126. In the exemplary embodiment the plurality of vias 130 include a first via 130A, proximate to the first transmission line terminus 108, and a second via 130B, proximate to a second transmission line terminus 109. In one such embodiment, the first and second vias 130A, 130B are the only vias coupling the first and second traces 125, 126. In other embodiments, first and second vias 130A, 130B are supplemented with one or more vias 130N disposed along the length of the transmission line circuit 160. With the plurality of vias 130 coupling the first and second traces 125 and 126, the traces together present a reduced AC resistance for a given lateral trace width of each trace. Embodiments employing multiple interconnect levels for the propagation, or return, of a single signal line are referred to herein as "hybrid" transmission line circuits.

The second transmission line terminus 109 is where the lateral run of the first and second traces 125, 126 across the package substrate 120 ends, for example at a via down to an interconnect level below that of the second trace 126, or more particularly, at a through-core via 122 extending through the package substrate core 121. Generally, where a stepped transmission line is formed within the substrate package, the line segment provided by the through-core via 122 (which is of a relatively large diameter) has a characteristic impedance ($Z_{0,i}$) that can poorly match characteristic impedances of lateral trace runs in interconnects levels provided in the build-up layers, particularly the characteristic impedance of interconnect levels between the core 121 and the IC chip 105 ($Z_{0,i+1}$) where traces are densest and trace geometries (i.e., lateral widths) smallest. Therefore, it is advantageous to design the transmission line circuit 160 segment between the breakout region and the through-core via 122 to provide a desired characteristic impedance for a best possible match with the through substrate via 122 while minimizing trace width.

Figures 2A, 2B:
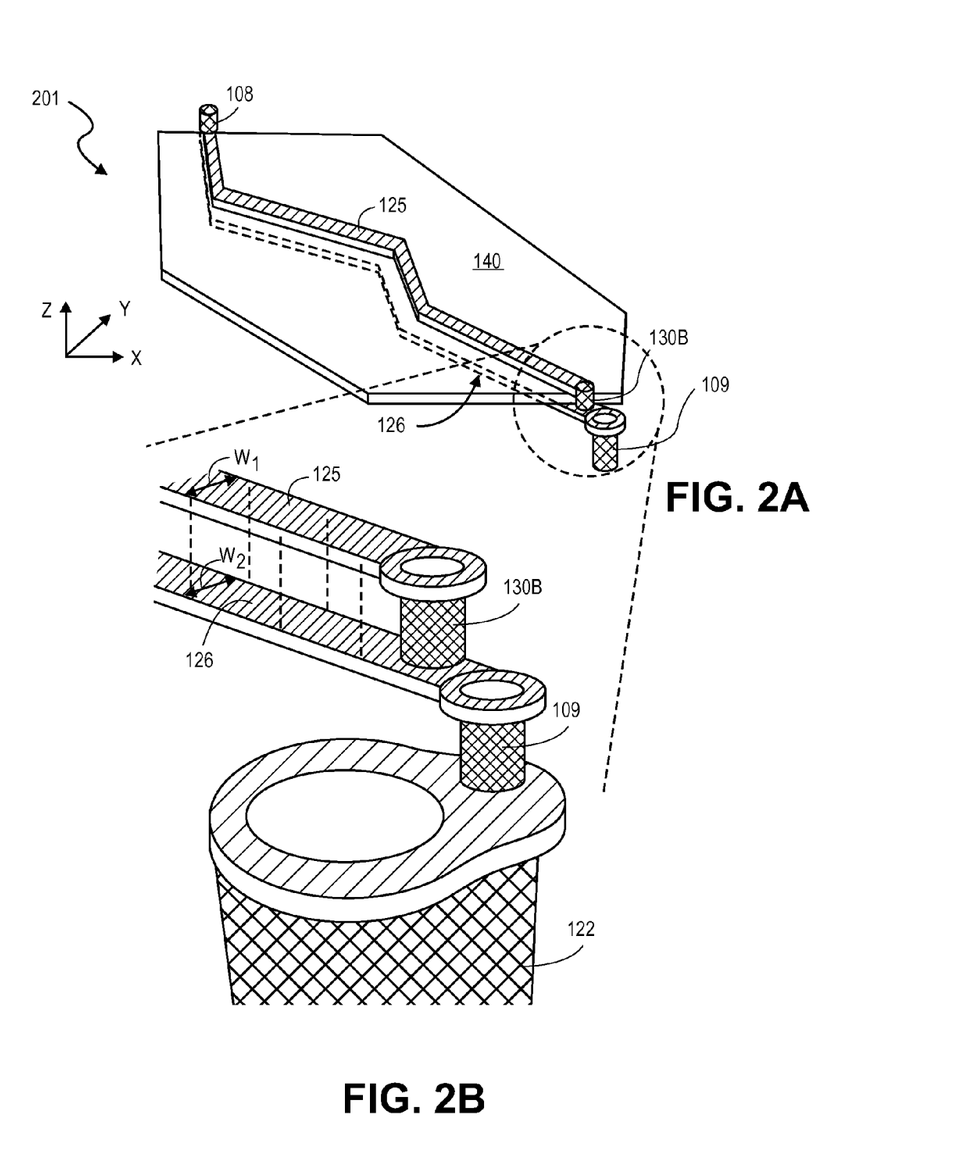
FIG. 2A is an isometric view of a package substrate interconnect level including a first trace defining a routing path for a package transmission line, in accordance with an embodiment.
FIG. 2B is an expanded isometric view of FIG. 2A further illustrating a second trace following the same routing path as the first trace, in accordance with an embodiment.

FIG. 2A is an isometric view illustrating a package substrate interconnect level 201 in which the first trace 125 defines a routing path for a package transmission line between the first terminus 108 and second terminus 109, in accordance with an embodiment. The routing path defined by the first trace 125 includes an arbitrary number of bends as a matter of engineering based on a number of performance constraints, and embodiments of the present invention are not limited with respect to the actual routing path. The second trace 126 is however to follow the same routing path as the first trace 125, however on a different interconnect level, as represented by the dashed line in FIG. 2A. The second trace 126 is therefore referred to herein as being "co-located" with the first trace 125.

FIG. 2B is an expanded isometric view of FIG. 2A further illustrating the second trace 126 following the same routing path as the first trace 125, in accordance with an embodiment. In FIG. 2B, dielectric material intervening between adjacent interconnect levels (e.g., dielectric material 140 shown in FIG. 1B) is not depicted for sake of clarity. As shown, the first trace 125 overlies the second trace 126 along the length of the routing path following by the transmission line (e.g., transmission line circuit 160). In the exemplary embodiment, the first and second traces have the same lateral width (i.e., $W_1=W_2$). In advantageous embodiments the lateral widths, $W_1$ and $W_2$ are both set to a minimum dimension required to provide a transmission line of desired characteristic impedance. As further illustrated in FIG. 2B, the via 130B proximate to the terminus 109 which couples to the through-core via 122 amount to a set of offset vias. In alternative embodiments, the via 130B, as well as the via serving as the terminus 109 may also be stacked along a same vertical axis (e.g., aligned with the longitudinal axis of the through-core via 122), where permitted by design rules.

In embodiments, the package transmission line circuit further comprises at least one electrically conductive reference plane separated from at least one of the first and second traces by a dielectric material disposed there between. The reference plane may be either a ground plane or a power plane, and in the exemplary embodiment a ground plane is coupled to a ground reference maintained at an electrical ground potential. Generally, either open (dispersive) or closed (non-dispersive) transmission line circuits may be designed based on a signal line employing co-located traces in two adjacent interconnect levels. Any technique known in the art may utilized to implement the reference plane within a package substrate, for example an interconnect level may be or a conductive webbing disposed within dielectric material separating adjacent interconnect levels may be utilized. Depending on the reference plane implementation, a particular characteristic impedance may be achieved for traces of a given width (and thickness).

FIGS. 3A, 3B, 3C, 3D, and 3E are cross-sectional views of package transmission line circuits along a z-y plane further illustrating reference planes in accordance with embodiments. Any of these exemplary designs may, for example, be implemented in the system 100 of FIGS. 1A and 1B, in which case the z-y plane depicted in FIGS. 3A-3E is represented by line A-A' in FIG. 1B.

Figure 3A:
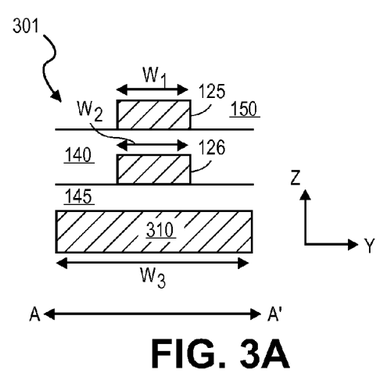
FIGS. 3A, 3B, 3C, 3D, and 3E are cross-sectional views of package transmission lines further illustrating reference planes in accordance with embodiments.
Figure 3B:
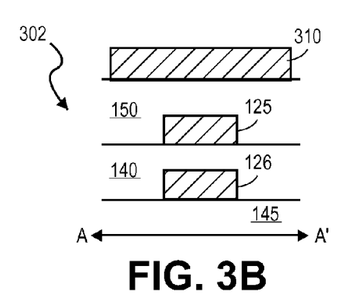

In embodiments, a package transmission line circuit includes one electrically conductive reference plane is separated from one of the first and second traces of a signal line by a dielectric material disposed between the trace and reference plane. The reference plane may be disposed on a same level of a package substrate as one of the interconnect levels employed by the signal line traces, or may be disposed on a package level other than the interconnect levels employed by the signal line traces. FIGS. 3A and 3B illustrate the later configuration with FIG. 3A illustrating a transmission line circuit 301 including the traces 125 and 126 disposed over a reference plane 310. As shown, the reference plane 310 is separated from the second trace 126 by an intervening dielectric material 145. FIG. 3B illustrates a transmission line circuit 302 including the traces 125 and 126 disposed under a reference plane 310. As shown, the reference plane 310 is separated from the first trace 125 by an intervening dielectric material 150.

Figure 3C:
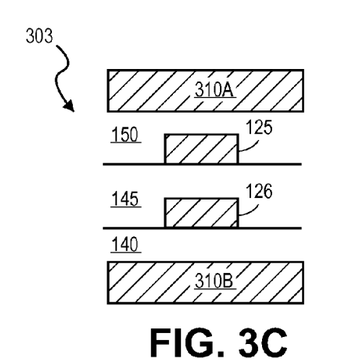

FIG. 3C is a cross-sectional view of an embodiment of a package transmission line circuit 303 where reference planes are disposed both above and below the first and second traces 125, 126. First and second electrically conductive reference planes 310A and 310B are disposed in parallel with the traces 125 and 126 disposed there between. The two conductive reference planes 310A and 310B are electrically coupled to a same power or ground reference. The first reference plane 310A is separated from the first trace 125 disposed in the interconnect level by the dielectric material 150 while the second reference plane 310B is separated from the second traces 126 in the second interconnect level by the dielectric material 140. In further embodiments, one or more vias may extend through the intervening isolative dielectric materials 150, 145, 140 to electrically couple the reference planes 310A and 310B together to a same reference potential.

Figure 3D:
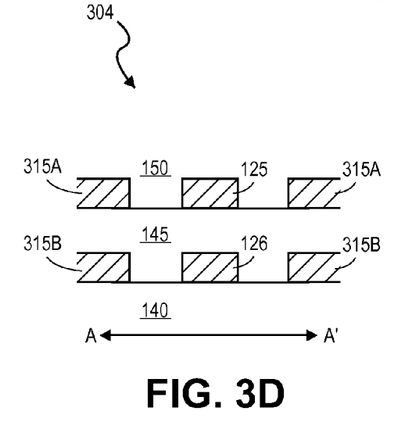

FIG. 3D is a cross-sectional view of an embodiment of a package transmission line circuit 304 including a reference plane that is co-planar with at least one of the traces 125, 126 (i.e., the reference plane is disposed in one of the first or second interconnect levels on opposite sides of the trace routing path). As shown in FIG. 3D, the reference plane runs adjacent to both of the traces 125 and 126 (planes 315A and 315B, respectively) forming parallel first and second co-planar reference planes. In further embodiments, one or more vias may extend through the intervening dielectric 145 to electrically couple the reference planes 315A and 315B together. Out of the plane of FIG. 3C, the reference planes 315A and 315B are further coupled together to a same potential (e.g., ground).

Figure 3E:
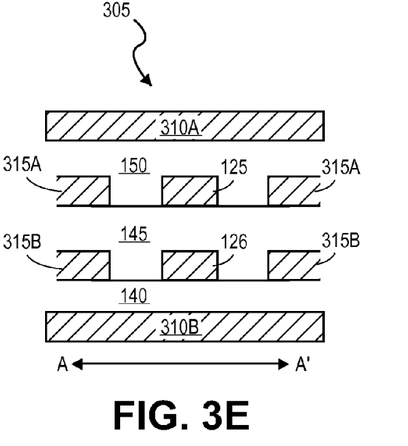

In embodiments, both co-planar reference planes and overlying and/or underlying reference planes are provided. FIG. 3E is a cross-sectional view of a fully enclosed embodiment where the implementation of FIG. 3C is supplemented with the co-planar reference plane implementation illustrated in FIG. 3D. For such transmission line circuits, the co-planar reference planes 315A advantageously run along a length of the trace 125 (i.e., adjacent to the trace routing path) and provide a lands for vias through the dielectric material 150 (coupling the reference plane 310A with the plane 315A) while the co-planar reference planes 315B provide lands for vias through the dielectric material 145 (coupling the reference plane 315A with the plane 315B). Vias then further couple the reference plane 315B to reference plane 310B to complete the transmission line circuit 305.

For the embodiments illustrated in FIGS. 3A, 3B, 3C, 3D and 3E, the dielectric material 145 may be the same or different material as the dielectric material 140 separating the second trace 126 from the first trace 125. Similarly, the dielectric material 150, if present, may also be the same or different as either of the dielectric materials 140 and 145. The thicknesses (z-dimension) of the dielectric materials 140, 145, and 150 may also be equal or one or more may be of a different thickness than the others. The lateral width of the reference plane 310, $W_3$, is typically greater than that of the traces ($W_1$ and $W_2$) and may be selected as a design parameter along with the trace widths $W_1$ and $W_2$, and dielectric material thicknesses, for example with a full-wave electromagnetic field solver to achieve a desired transmission line performance, many of which are commercially available.

In embodiments, the first and second traces 125, 126 form one signal line of a balanced pair of signal lines. The second signal line of the balanced pair then further includes third and fourth co-located traces, typically running parallel to the first and second traces 125, 126 such that the balanced pair of signal lines defines a routing path for the transmission line circuit. The balanced pair transmission line circuit generally employs one signal line (e.g., that formed by co-located traces 125, 126) for signal propagation and the second signal line for the signal return path. This type of circuit is advantageous for common-mode noise rejection and is conducive to differential signals.

Figure 4A:
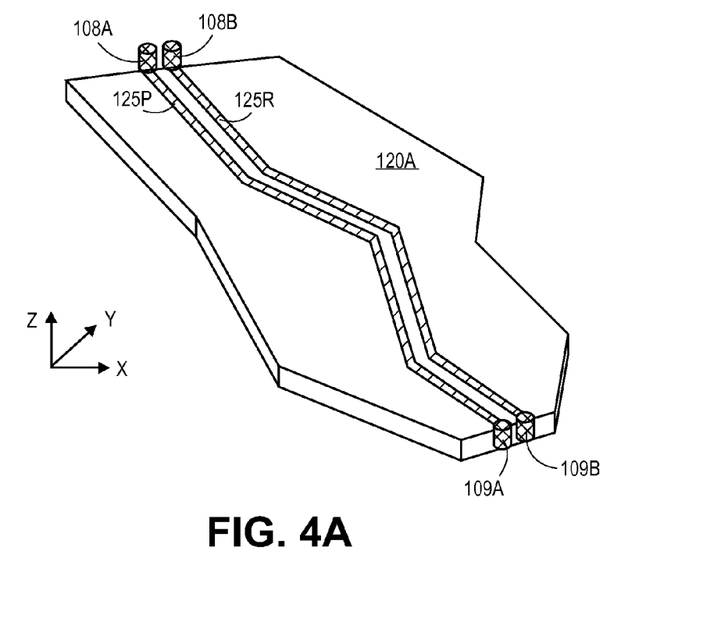
FIG. 4A is an isometric view of a package substrate interconnect level including a pair of traces defining a balanced signal line routing path, in accordance with an embodiment.

In embodiments, the signal lines of the balanced pair are to have substantially equal impedances along their lengths as well as substantially equal impedances to at least one reference plane. As such, any of the exemplary embodiments illustrated in FIGS. 1A-3E may be replicated to implement a balanced pair of signal lines. For example, FIG. 4A illustrates a routing path in a first interconnect level 400 for balanced pair of traces 125P and 125R between a first pair of termini 108A, 108B and a second pair of termini 109A, 109B. While again the exact routing path is immaterial, the balanced pair of traces 125P and 125R are spaced apart by a constant distance along the entire path between the first and second termini. For each of the traces 125P and 125R, there is a co-located trace disposed on an adjacent interconnect level (either above or below the interconnect level 400), as previously described in the context of a single signal line.

Figure 4B:
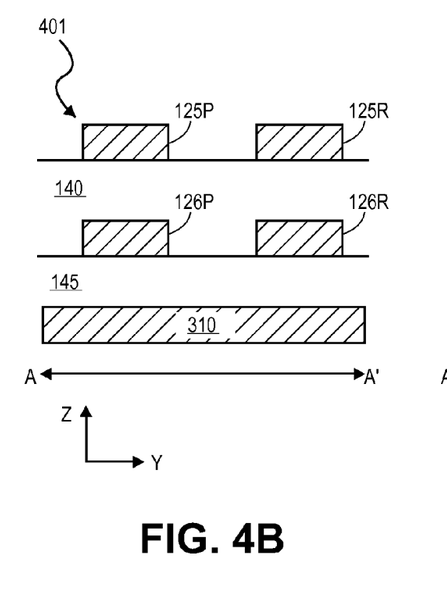
FIGS. 4B and 4C are cross-sectional views of package transmission lines, in accordance with embodiments.
Figure 4C:
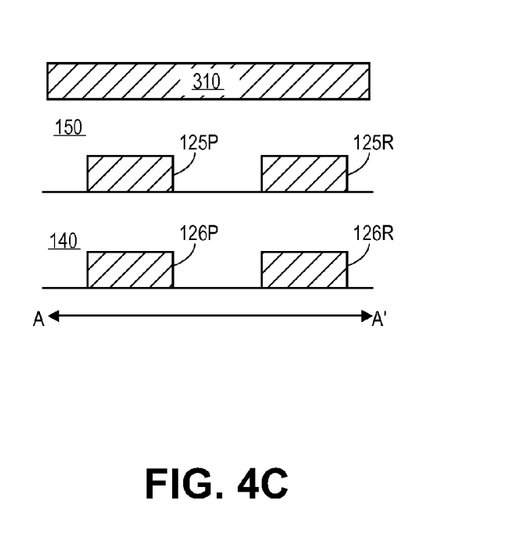

FIGS. 4A and 4B are balanced signal line pair analogs to the FIGS. 3A and 3B described elsewhere herein. Again, any of these exemplary designs may, for example, be implemented in the system 100 of FIGS. 1A and 1B, in which case the z-y plane depicted in FIGS. 4A and 4B is represented by line A-A' in FIG. 1B. As shown in FIG. 4B, the reference plane 310 is disposed below the co-located traces 125P and 126P, as well as below the co-located traces 125R and 126R. Each of the co-located traces are electrically coupled together, for example with the first and second traces 125P and 126P coupled together with at least a first pair of vias at points proximate to the first terminus 108A and second terminus 109A and a second pair of vias coupling third and fourth traces 125R and 126R at points proximate to the first terminus 108B and second terminus 109B. FIG. 4B illustrates how the reference plane 310 may alternatively be implement in an interconnect level disposed above the balanced pair of co-located traces. Any of the other reference plane embodiments illustrated in FIGS. 3C through 3E may of course also be implemented for co-located traces of a balanced pair of signal lines.

Figure 5A:
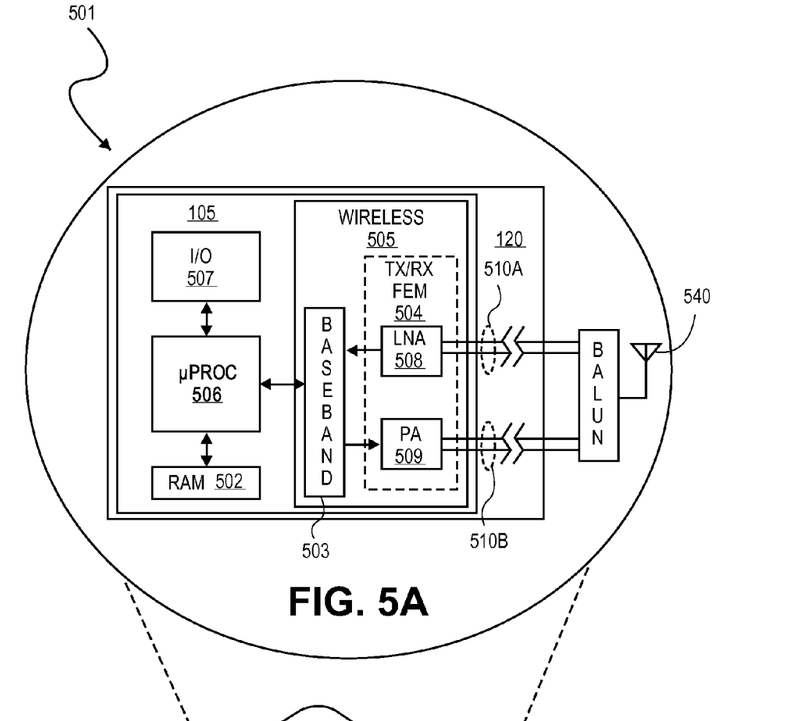
FIG. 5A is a functional block diagram of a system employing a package transmission line, in accordance with an embodiment.

While the package transmission line circuits described thus far may be implemented for a number of narrowband or broadband high-speed signals, FIG. 5A is a functional block diagram of a system 501 employing a package transmission line in accordance with an embodiment that has been extensively studied and found to be particularly advantageous. The system 501 includes an IC chip 105 including an RF or wireless module 505 that generally may be of any design known in the art and, more specifically is operable at a frequency of 0.9 GHz, or higher (e.g., 2.4 GHz). The RF module 505 includes an RF signal receiver (Rx), RF signal transmitter (Tx), or RF signal transceiver (Tx/Rx) with a baseband processor 503 and a front end module (FEM) 504 that further includes a low noise amplifier (LNA) 508 on a receiver path and a power amplifier (PA) 512 on a transmit path, as well as filters, mixers, etc., between the baseband processor 503 and antenna 540.

In the exemplary embodiment the IC chip 105 is a system-on-a-chip (SoC) including the wireless (RF) module 505 as well as at least one logic microprocessor core 506 (i.e., an applications processor of the system 501). In the exemplary embodiment, at least one alternate input/output (I/O) interface 507 (e.g., USB, SATA, PCIe, etc.) and a memory 502 are further provided in the system 501. In some embodiments, the IC chip 105 may entail only a wireless module with the logic processor core 506 and/or alternate I/O interface 507 provided by a separate/discrete chip that is integrated onto the same package substrate 120 as an (RF) IC chip 105. In either implementation, the hybrid transmission line circuit embodiments described herein take advantage of the relatively high metal layer count found in package substrates suitable for a microprocessor. As such, the multiple metal layers needed as redistribution layers for microprocessor chip packaging may synergistically implement the hybrid transmission line embodiments described herein at substantially no additional cost.

In embodiments, at least one of the wireless module 505, memory 502, logic processor core 506, and alternate I/O interface 507 is connected to an embodiment of the hybrid transmission line circuits described herein. For example, a high speed communication link between any two of the RF module 505, logic processor core 506, and alternate I/O interface 507 may be implemented with an embodiment of the hybrid transmission line circuits described herein. As further illustrated in FIG. 5A for example, the LNA 508, or a preamplifier, is connected to differential input signal routing 510A which is routed off IC chip 105 and onto the package substrate 120. From the package substrate, the signal is further routed to an RF signal switch, balun, or a feedline of the antenna 540, for example by routing traces on a PCB. An RF signal switch, for example, may include a controlled switch having signal terminals connected to one of the transmission line circuit embodiments described herein.

In the exemplary embodiment, the LNA input signal routing on the package substrate 120 is implemented with a transmission line circuit described elsewhere herein, for example the transmission line circuit 160. An analogous transmit path may also be provided with a portion of the on-package transmit path 510B between the PA 509 and the antenna 540 employing an embodiment of the hybrid transmission line circuits described herein.

In one embodiment where the LNA 508 includes a differential input, the transmission line circuit 160 is implemented with a balanced pair of signal lines that are electrically coupled to the differential input (e.g., as a segment of a stepped transmission line circuit extending through the package between second level interconnects and C4 bumps (or breakout region). Each signal line of the balanced pair entails a pair of co-located traces on adjacent interconnect levels of the package substrate 120. This configuration has been found to be particularly advantageous because the LNA 508 benefits from input signal routing having matched input impedance and low differential insertion loss. In further embodiments, the PA 509, or RF signal driver, may include a differential input coupled to the transmission line circuit 160 with first and second traces of the transmission line circuit including one signal line of a balanced pair electrically coupled to the differential input.

In frequency domain, a balanced transmission line circuit with two signal lines, each employing co-located traces on adjacent package interconnect levels in accordance with an embodiment of the present invention was compared to a conventional microstrip circuit. For these comparisons, the termini were modeled as ideal 50Ω loads. S-parameter results including differential return loss and insertion loss/transfer function comparisons generally indicate the transmission line circuit in accordance with an embodiment of the present invention had higher return loss (thus lower signal reflection), as well as higher transmitted energy output at frequencies below about 5 GHz.

In time domain, relative to a microstrip signal line implementation with traces of similar width as the co-located traces in a transmission line circuit in accordance with an embodiment, the package transmission line circuit in accordance with an embodiment of the present invention displayed reduced impedance mismatch. Generally, reflection peaks and/or valleys are of a lesser magnitude for the package transmission line circuit in accordance with an embodiment of the present invention than for the microstrip (of similar trace width).

Similar comparisons were also performed between a conventional stripline circuit and the package transmission line circuit in accordance with an embodiment of the present invention. It was found that as signal rise time became shorter (steeper), the package segment with the greatest impedance mismatch from 50Ω segments becomes more evident. However, for the package transmission line circuit in accordance with an embodiment of the present invention, signal refection is reduced, particularly with 5 ps rise times. C4 bump breakout, through-core vias, and second level interconnect solder balls which deviate most from 50Ω can be improved with the package transmission line circuits described herein. Most dramatically, for a 5 ps rise time the bump breakout region deviation was reduced by approximately 10Ω, representing a reduction in signal reflection by approximately 20% over a single layer stripline circuit employing traces of similar lateral width.

Figure 5B:
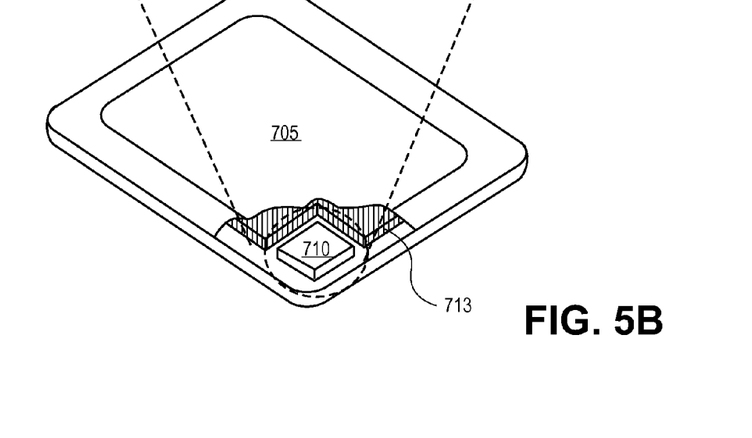
FIG. 5B is an isometric view of a mobile computing device employing the system of FIG. 5A, in accordance with an embodiment.

FIG. 5B is an isometric view of a mobile computing device 700 employing the system 501, in accordance with an embodiment. The mobile computing device or platform 700 may be any portable device configured for each of electronic data display, electronic data processing, and wireless electronic data transmission. For example, the mobile computing device 700 may be any of a tablet, a smart phone, laptop computer, other intent device, etc. and includes a display screen 705, the system 501, and a battery 713. With the package transmission line circuits described herein, the form factor of the package substrate 120 can be reduced relative to convention transmission line circuits, enabling the mobile computing device 700 to either have a concomitantly reduced form factor or a greater region within a given device form factor available to the battery 713 for longest operative lifetimes between charging, or available to memory (not depicted), such as a solid state drive for greatest functionality. Longer operative lifetimes for a given battery size may also be achieved through lower transmission loses which contribute to a reduction in platform power consumption relative those employing conventional transmission line circuits.

It is to be understood that the above description is illustrative and not restrictive as many other embodiments will be apparent to those of skill in the art upon reading and understanding the above description. The present invention has been described with reference to specific exemplary embodiments. For example, in a first embodiment an integrated circuit (IC) package transmission line circuit includes: a first conductive trace defining a routing path between a first terminus and a second terminus on a first interconnect level of a package substrate; a second conductive trace following the routing path on a second interconnect level of the package substrate separated from the first interconnect level by a first dielectric material disposed there between; and a plurality of vias extending through the first dielectric material and electrically coupling the first and second traces.

In a further embodiment, the plurality of vias include a first via proximate to the first terminus and a second via proximate to the second terminus. In a further embodiment, the plurality of vias further includes at least one via disposed along the routing path between the first and second vias.

In another embodiment, the first and second traces comprise one signal line of a balanced pair of signal lines having substantially equal impedances along their lengths and substantially equal impedances to at least one reference plane. In a further embodiment, the plurality of vias include: a first pair of vias coupling the first and second traces at points proximate to the first terminus and second terminus; and a second pair of vias coupling third and fourth traces of a second signal line in the balanced pair at points proximate to the first terminus and second terminus.

In embodiments, the package transmission line circuit further includes at least one electrically conductive reference plane separated from at least one of the first and second traces by a second dielectric material disposed there between. In further embodiments, the reference plane further includes a reference plane disposed on a level of the package substrate other than the first and second interconnect levels. In further embodiments, reference plane further includes parallel first and second electrically conductive reference planes electrically coupled to a same power or ground reference, the first reference plane separated from the first interconnect level by the second dielectric material, and the second reference plane separated from the second interconnect level by a third dielectric material.

In embodiments, the reference plane further comprises at least one co-planar reference plane disposed in at least one of the first and second interconnect levels and on opposite sides of the routing path. In further embodiments, the co-planar reference plane further comprises parallel first and second co-planar reference planes, the first co-planar reference plane disposed on the first interconnect level and on opposite sides of the first trace, and the second co-planar reference plane disposed on the second interconnect level and on opposite sides of the second trace, wherein the parallel first and second co-planar reference planes are electrically coupled to a same power or ground reference.

In embodiments, a package transmission line circuit routing path extends from a bump breakout region to a plated through hole extending through a core of the package substrate.

In an embodiment, a packaged integrated circuit (IC) includes: an IC chip including a RF signal receiver or transmitter; a package substrate coupled to the IC chip, the package substrate including a transmission line circuit coupled to the RF signal receiver or transmitter, and wherein the transmission line circuit further comprises: a first trace defining a routing path between a first terminus and a second terminus on a first interconnect level of a package substrate; a second trace following the routing path on a second interconnect level of the package substrate separated from the first interconnect level by a first dielectric material disposed there between; a plurality of vias extending through the first dielectric material and electrically coupling the first and second traces; and at least one electrically conductive reference plane separated from at least one of the first and second traces by a second dielectric material disposed there between.

In further embodiments, the RF signal receiver or transmitter is operable at a frequency of at least 2.4 GHz. In further embodiments, the RF signal receiver or transmitter includes an RF low-noise amplifier (LNA) having an input coupled to the transmission line circuit. In further embodiments, the LNA includes a differential input coupled to the transmission line circuit and wherein the first and second traces of the transmission line circuit comprises one signal line of a balanced pair electrically coupled to the differential input.

In embodiments, the package transmission line includes a first pair of vias coupling separate ones of the balanced pair proximate to the first terminus; and a second pair of vias coupling the separate ones of the balanced pair proximate to the second terminus. In further embodiments, the plurality of vias further comprise at least one via disposed along the routing path between the first and second via.

In embodiments, an integrated circuit (IC) package substrate, including: a core having through core vias disposed therein; a plurality of build-up layers, each build-up layer comprising an interconnect level and a dielectric layer; a bump breakout region formed in one of the interconnect levels; and a transmission line circuit extending between the bump breakout region and a pair of the through core vias, wherein the transmission line circuit further comprises: a first pair of traces defining a balanced signal line routing path between a first termini in the bump breakout region and a second termini on a first interconnect level of a package substrate; a second pair of traces following the routing path on a second interconnect level of the package substrate separated from the first interconnect level by a first dielectric layer disposed there between; a plurality of vias extending through the first dielectric layer and electrically coupling ones of the first pair of traces with ones of the second pair of traces disposed in vertical alignment; and at least one electrically conductive reference plane separated from at least one of the first and second pair of traces by a second dielectric material disposed there between.

In a further embodiment, the first and second termini comprise stacked or offset vias coupling together the first and second pairs of traces. In a further embodiment, the first and second termini further comprise stacked or offset vias further coupling the first and second trace pairs to the through core via.

Although these many exemplary embodiments are described herein, it will be recognized that the invention is not limited to the embodiments described, but can be practiced with modification and alteration without departing from the scope of the appended claims. The scope of the invention should, therefore, be determined with reference to the appended claims, along with the full scope of equivalents to which such claims are entitled.

What is claimed is:

1. A package transmission line circuit, comprising:
    a first conductive trace defining a routing path on a first interconnect level of a package substrate;
    a second conductive trace co-located with the first conductive trace on a second interconnect level of the package substrate separated from the first interconnect level by a first dielectric material disposed there between;
    a plurality of vias extending through the first dielectric material and electrically coupling the first and second traces; and
    a plated through hole formed in a layer of the package substrate below the second conductive trace and electrically coupled to the second conductive trace by a via proximate to a first end of the routing path.

2. The package transmission line circuit of claim 1, wherein the plurality of vias comprises a first via proximate to the first end of the routing path and a second via proximate to a second end of the routing path.

3. The package transmission line circuit of claim 2, wherein the plurality of vias further comprises at least one via disposed along the routing path between the first and second vias.

4. The package transmission line circuit of claim 1, wherein the first and second traces comprise one signal line of a balanced pair of signal lines having substantially equal impedances along their lengths and substantially equal impedances to at least one reference plane.

5. The package transmission line circuit of claim 4, wherein the plurality of vias comprises:
    a first group of vias coupling the first and second traces at points proximate to the first end of the routing path and a second end of the routing path; and
    a second group of vias coupling third and fourth traces of a second signal line in the balanced pair at points proximate to the first end of the routing path and the second end of the routing path.

6. The package transmission line circuit of claim 1, further comprising at least one electrically conductive reference plane separated from at least one of the first and second traces by a second dielectric material disposed there between.

7. The package transmission line circuit of claim 6, wherein the at least one reference plane further comprises a reference plane disposed on a level of the package substrate other than the first and second interconnect levels.

8. The package transmission line circuit of claim 7, wherein the at least one reference plane further comprises parallel first and second electrically conductive reference planes electrically coupled to a same power or ground reference, the first reference plane separated from the first interconnect level by the second dielectric material, and the second reference plane separated from the second interconnect level by a third dielectric material.

9. The package transmission line circuit of claim 6, wherein the at least one reference plane further comprises at least one co-planar reference plane disposed in at least one of the first and second interconnect levels and on opposite sides of the routing path.

10. The package transmission line circuit of claim 9, wherein the at least one co-planar reference plane further comprises parallel first and second co-planar reference planes, the first co-planar reference plane disposed on the first interconnect level and on opposite sides of the first trace, and the second co-planar reference plane disposed on the second interconnect level and on opposite sides of the second trace, wherein the parallel first and second co-planar reference planes are electrically coupled to a same power or ground reference.

11. The package transmission line circuit of claim 1, wherein the routing path extends from a bump breakout region to the plated through hole and wherein the plated through hole extends through a core of the package substrate.

12. A packaged integrated circuit (IC), comprising:
    an IC chip electrically coupled to a package substrate, wherein the IC chip includes a RF signal receiver, transmitter, or switch;
    a logic processor electrically coupled to the package substrate; and
    an input/output (I/O) bus electrically coupled to the package substrate, wherein the package substrate includes a transmission line circuit that provides a communication link between at least two of: the logic processor, the (I/O) bus, and the RF signal receiver or transmitter, and wherein the transmission line circuit further comprises:
        a first trace defining a routing path on a first interconnect level of a package substrate;
        a second trace following the routing path on a second interconnect level of the package substrate separated from the first interconnect level by a first dielectric material disposed there between;
        a plurality of vias extending through the first dielectric material and electrically coupling the first and second traces; and
        at least one electrically conductive reference plane separated from at least one of the first and second traces by a second dielectric material disposed there between.

13. The packaged IC of claim 12, wherein the signal receiver, transmitter, or switch is operable at a frequency of at least 0.9 GHz.

14. The packaged IC of claim 13, wherein the RF signal receiver, transmitter or switch includes one of:
    an RF low-noise amplifier (LNA) or an RF preamplifier having an input coupled to the transmission line circuit; or
    a power amplifier (PA) or an RF signal driver having an output coupled to the transmission line circuit; or
    a controlled switch having signal terminals connected to the transmission line circuit.

15. The packaged IC of claim 14, wherein the PA or the driver includes a differential output coupled to the transmission line circuit and wherein the first and second traces of the transmission line circuit comprises one signal line of a balanced pair electrically coupled to the differential output.

16. The packaged IC of claim 14, wherein the RF signal switch includes a differential terminal connected to the transmission line circuit and wherein the first and second traces of the transmission line circuit comprises one signal line of a balanced pair electrically coupled to the differential terminal.

17. The packaged IC of claim 14, wherein the LNA or the preamplifier includes a differential input coupled to the transmission line circuit and wherein the first and second traces of the transmission line circuit comprises one signal line of a balanced pair electrically coupled to the differential input.

18. The package transmission line circuit of claim 17, wherein the plurality of vias comprises:
a first pair of vias coupling separate ones of the balanced pair proximate to a first end of the routing path; and
a second pair of vias coupling the separate ones of the balanced pair proximate to a second end of the routing path.

19. The package IC of claim 18, wherein the plurality of vias further comprise at least one via disposed along the routing path between the first and second via.

20. A package substrate, comprising:
a core having through core vias disposed therein;
a plurality of build-up layers, each build-up layer comprising an interconnect level and a dielectric layer;
a bump breakout region formed in one of the interconnect levels; and
a transmission line circuit extending between the bump breakout region and a pair of the through core vias, wherein the transmission line circuit further comprises:
a first pair of traces defining a balanced signal line routing path between the bump breakout region and the pair of through core vias on a first interconnect level of a package substrate;
a second pair of traces following the routing path on a second interconnect level of the package substrate separated from the first interconnect level by a first dielectric layer disposed there between;
a plurality of vias extending through the first dielectric layer and electrically coupling ones of the first pair of traces with ones of the second pair of traces disposed in vertical alignment; and
at least one electrically conductive reference plane separated from at least one of the first and second pair of traces by a second dielectric material disposed there between.

21. The package substrate of claim 20, wherein the first pair of traces are coupled to the bump breakout region with a first pair of offset vias, and wherein the second pair of traces are each coupled to one of the pair of through core vias by a second pair of offset vias.

22. The package substrate of claim 20, wherein the first pair of traces are coupled to the bump breakout region with a first pair of stacked vias, and wherein the second pair of traces are each coupled to one of the pair of through core vias by a second pair of stacked vias.

* * * * *